US012603595B2

(12) United States Patent
Butler

(10) Patent No.: US 12,603,595 B2
(45) Date of Patent: Apr. 14, 2026

(54) ELECTROMAGNETIC MOTOR SYSTEM, POSITION CONTROL SYSTEM, STAGE APPARATUS, LITHOGRAPHIC APPARATUS, METHOD OF DETERMINING A MOTOR-DEPENDENT COMMUTATION MODEL FOR AN ELECTROMAGNETIC MOTOR

(71) Applicant: ASML Netherlands B.V., Veldhoven (NL)

(72) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 65 days.

(21) Appl. No.: 18/577,062

(22) PCT Filed: Jun. 30, 2022

(86) PCT No.: PCT/EP2022/068210
§ 371 (c)(1),
(2) Date: Jan. 5, 2024

(87) PCT Pub. No.: WO2023/280690
PCT Pub. Date: Jan. 12, 2023

(65) Prior Publication Data
US 2024/0313684 A1    Sep. 19, 2024

(30) Foreign Application Priority Data
Jul. 9, 2021    (EP) ..................................... 21184807

(51) Int. Cl.
H02P 25/064      (2016.01)
G03F 7/00        (2006.01)
H02P 23/00       (2016.01)

(52) U.S. Cl.
CPC ........ *H02P 25/064* (2016.02); *G03F 7/70516* (2013.01); *G03F 7/70725* (2013.01);
(Continued)

(58) Field of Classification Search
CPC .............. H02P 25/064; H02P 23/0022; G03F 7/70516; G03F 7/70725; G03F 7/70758; G03F 7/70775
See application file for complete search history.

(56) References Cited

U.S. PATENT DOCUMENTS 6,020,964 A      2/2000  Loopstra et al.
6,952,253 B2    10/2005  Lof et al.
(Continued)

FOREIGN PATENT DOCUMENTS

WO      WO 2011/145743 A1    11/2011
WO      WO 2016/005568 A1     1/2016

OTHER PUBLICATIONS

International Search Report and Written Opinion of the International Searching Authority directed to International Patent Application No. PCT/EP2022/068210, mailed Oct. 11, 2022; 9 pages.

*Primary Examiner* — Zoheb S Imtiaz
(74) *Attorney, Agent, or Firm* — FINNEGAN, HENDERSON, FARABOW, GARRETT & DUNNER, LLP

(57) ABSTRACT

The invention provides a method of determining a motor-dependent commutation model for an electromagnetic motor, whereby the electromagnetic motor comprises a first member comprising a coil array comprising at least M coils, and a second member comprising a magnet array configured to generate a spatially alternating magnetic field, whereby the first member and the second member are configured to displace relative to each other in N degrees of freedom, N<M, by supplying the at least M coils with respective at least M currents Im, thereby generating forces in the N
(Continued)

degrees of freedom, the method comprising the steps of: obtaining a commutation model G for the electromagnetic motor, the general commutation model G providing a relationship between desired forces Fc in the N degrees of freedom and the at least M currents Im applied to the coil array by Im=G*Fc.

20 Claims, 7 Drawing Sheets

(52) U.S. Cl.
CPC ...... *G03F 7/70758* (2013.01); *G03F 7/70775* (2013.01); *H02P 23/0022* (2013.01)

(56) References Cited

U.S. PATENT DOCUMENTS

| | | | |
|---|---|---|---|
| 2007/0058173 A1 | 3/2007 | Holzapfel | |
| 2007/0164697 A1* | 7/2007 | Cox | H02P 25/06 |
| | | | 318/135 |
| 2008/0275661 A1 | 11/2008 | Yang et al. | |
| 2010/0073653 A1* | 3/2010 | Shibazaki | H01L 21/681 |
| | | | 355/72 |
| 2012/0127447 A1* | 5/2012 | Yang | H02P 6/006 |
| | | | 355/72 |
| 2018/0367067 A1* | 12/2018 | Yang | H02K 41/031 |

\* cited by examiner

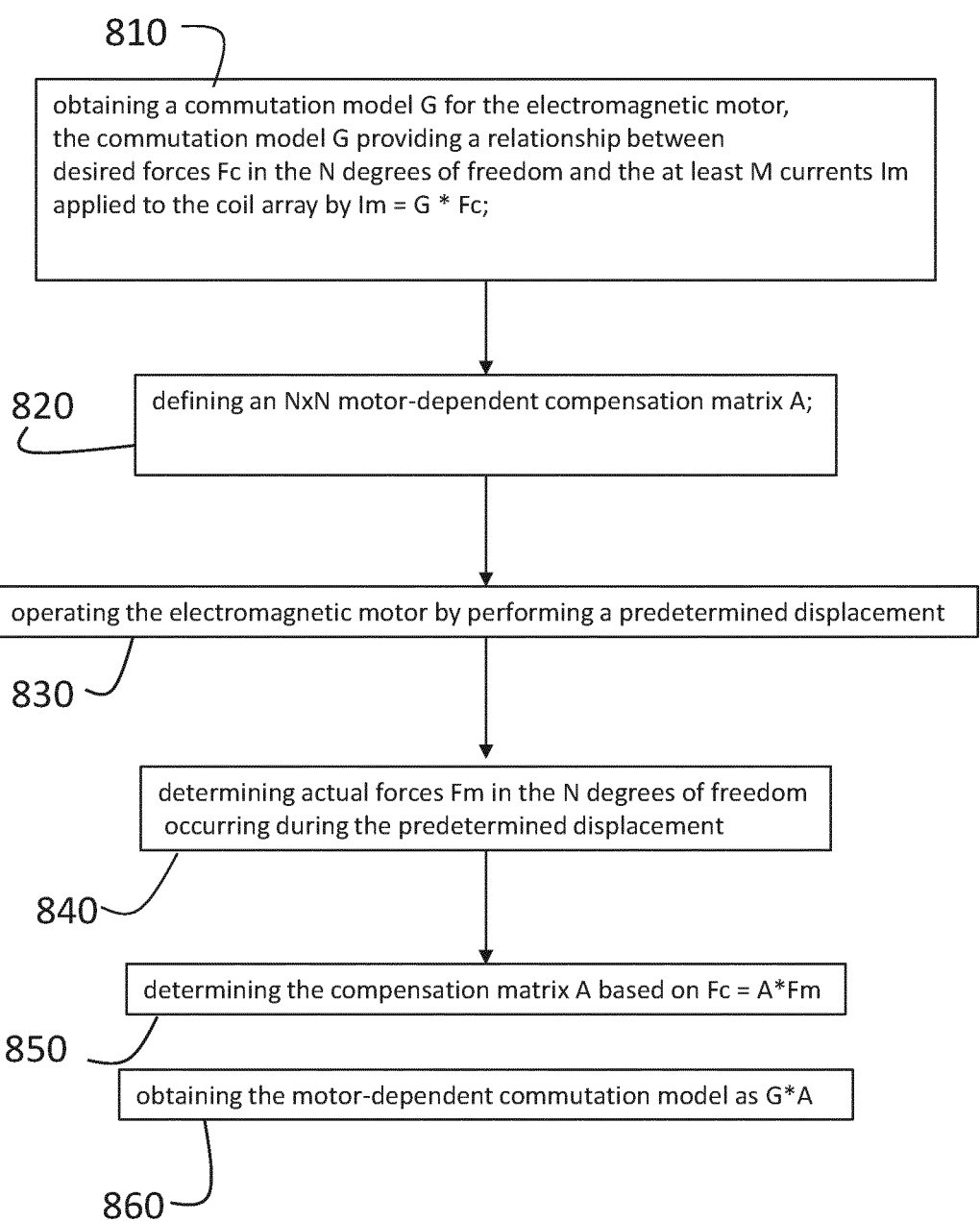

810 obtaining a commutation model G for the electromagnetic motor,
the commutation model G providing a relationship between
desired forces Fc in the N degrees of freedom and the at least M currents Im
applied to the coil array by Im = G * Fc;

820     defining an NxN motor-dependent compensation matrix A;

operating the electromagnetic motor by performing a predetermined displacement

830 determining actual forces Fm in the N degrees of freedom
occurring during the predetermined displacement

840 determining the compensation matrix A based on Fc = A*Fm

850 obtaining the motor-dependent commutation model as G*A

ELECTROMAGNETIC MOTOR SYSTEM, POSITION CONTROL SYSTEM, STAGE APPARATUS, LITHOGRAPHIC APPARATUS, METHOD OF DETERMINING A MOTOR-DEPENDENT COMMUTATION MODEL FOR AN ELECTROMAGNETIC MOTOR

CROSS-REFERENCE TO RELATED APPLICATION

The application claims priority of EP application Ser. No. 21/184,807.2 which was filed on 9 Jul. 2021 and which is incorporated herein in its entirety by reference.

FIELD

The present invention relates to electromagnetic motors and their application in a lithographic apparatus. In particular, the invention relates to determining a motor-dependent commutation model for an electromagnetic motor, said model enabling a more accurate positioning of the motor.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Typically, the process of projection of a pattern, e.g. a pattern on a patterning device or reticle, involves a synchronised movement of a support holding the patterning device and an object table holding the substrate. Such supports are typically equipped with one or more motors or actuators, e.g. electromagnetic motors such as linear or planar motors. In order to ensure that a desired relative position of the pattern or patterning device and the substrate is realised, a high position accuracy of the motors or actuators is desired. Due to mechanical tolerances and variations in physical properties of the components of the motors, the motors or actuators need to be calibrated, in order to achieve the desired accuracy. In particular, an accurate motor model needs to be established to determine the appropriate control signals for the motor, to arrive at the desired positional accuracy.

Known calibration processes are found to be time-consuming and cumbersome, due to the many variables or unknowns involved.

SUMMARY

It would be desirable to obtain an accurate model for an electromagnetic motor in a more efficient manner, compared to known methods.

According to a first aspect of the invention, there is provided a method of determining a motor-dependent commutation model for an electromagnetic motor, whereby the electromagnetic motor comprises a first member comprising a coil array comprising at least M coils, and a second member comprising a magnet array configured to generate a spatially alternating magnetic field, whereby the first member and the second member are configured to displace relative to each other in N degrees of freedom, $N < M$, by supplying the at least M coils with respective at least M currents Im, thereby generating forces in the N degrees of freedom, the method comprising the steps of:

obtaining a commutation model G for the electromagnetic motor, the general commutation model G providing a relationship between desired forces Fc in the N degrees of freedom and the at least M currents Im applied to the coil array by $Im = G*Fc$;

defining an N×N motor-dependent compensation matrix A;

operating the electromagnetic motor by performing a predetermined displacement by:

determining the desired forces Fc to realise the predetermined displacement determining the at least M currents Im for the coil array by $Im = G*Fc$;

applying the at least M currents Im to perform the predetermined displacement;

determining actual forces Fm in the N degrees of freedom occurring during the predetermined displacement;

determining the compensation matrix A based on $Fc = A*Fm$.

obtaining the motor-dependent commutation model as $G*A$.

According to a second aspect of the invention, there is provided an electromagnetic motor system, the electromagnetic motor system comprises an electromagnetic motor, comprising a first member and a second member, the first member comprising a coil array comprising at least M coils;

the second member comprising an array of magnets configured to generate a spatially alternating magnetic field, whereby the first member and the second member are configured to displace relative to each other in N degrees of freedom, $N < M$, by supplying the at least M coils with respective at least M currents Im, thereby generating forces in the N degrees of freedom, the electromagnetic motor system further comprising a control unit configured to generate control signals for controlling the electromagnetic motor, whereby the control unit comprises a motor-dependent commutation model obtained using the method according to the invention.

According to a third aspect of the invention, there is provided a position control system for an electromagnetic motor, the electromagnetic motor comprising a first member and a second member, the first member comprising a coil array comprising at least M coils;

the second member comprising an array of magnets configured to generate a spatially alternating magnetic field, whereby the first member and the second member are configured to displace relative to each other in N degrees of freedom, N<M, by supplying the at least M coils with respective at least M currents Im, thereby generating forces in the N degrees of freedom, the position control system comprising a control unit configured to generate control signals for controlling the electromagnetic motor, whereby the control unit comprises a motor-dependent commutation model obtained using the method according to the invention.

BRIEF DESCRIPTION OF THE DRAWINGS

Embodiments of the invention will now be described, by way of example only, with reference to the accompanying schematic drawings, in which:

FIG. 8 schematically depicts a flow chart of a method according to the present invention;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
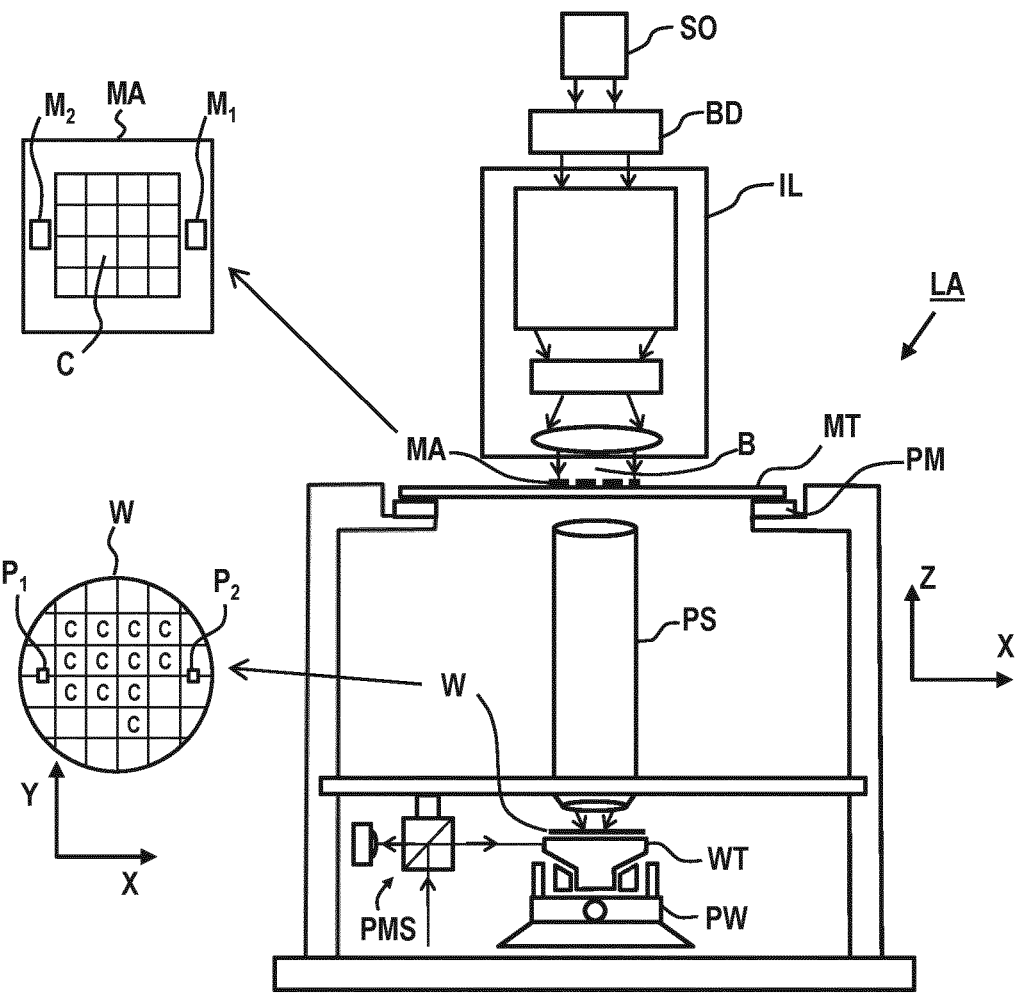
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W-which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
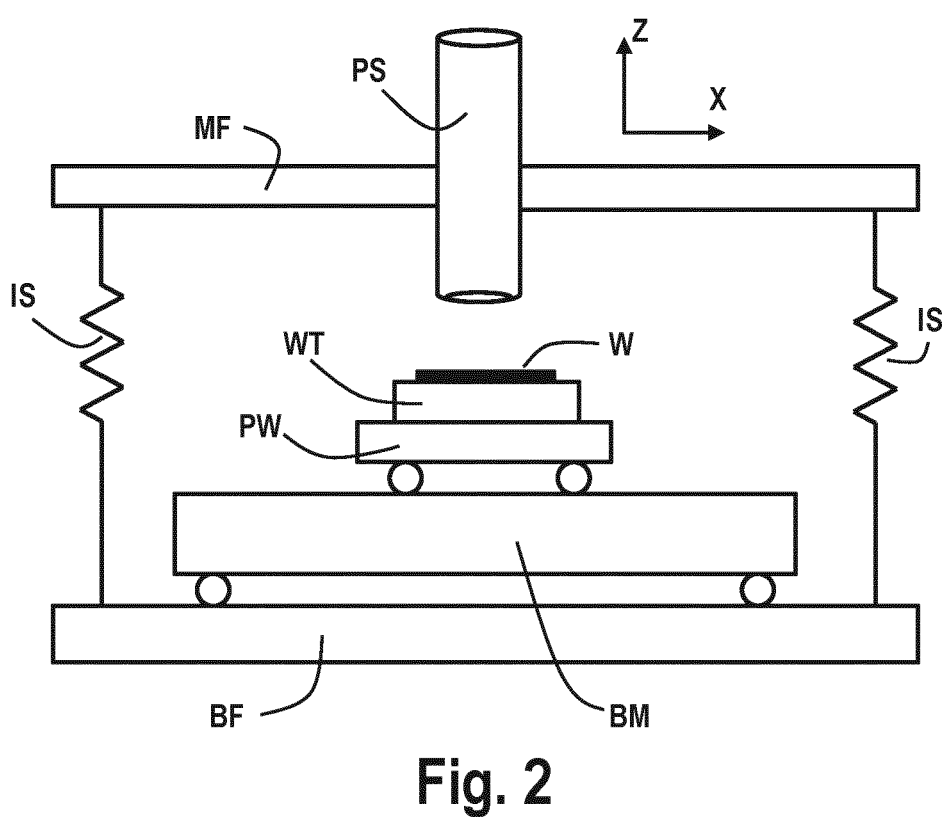
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator. In an embodiment, the first positioner PM or the second positioner PW can comprise an electromagnetic motor system according to the present invention.

Figure 3:
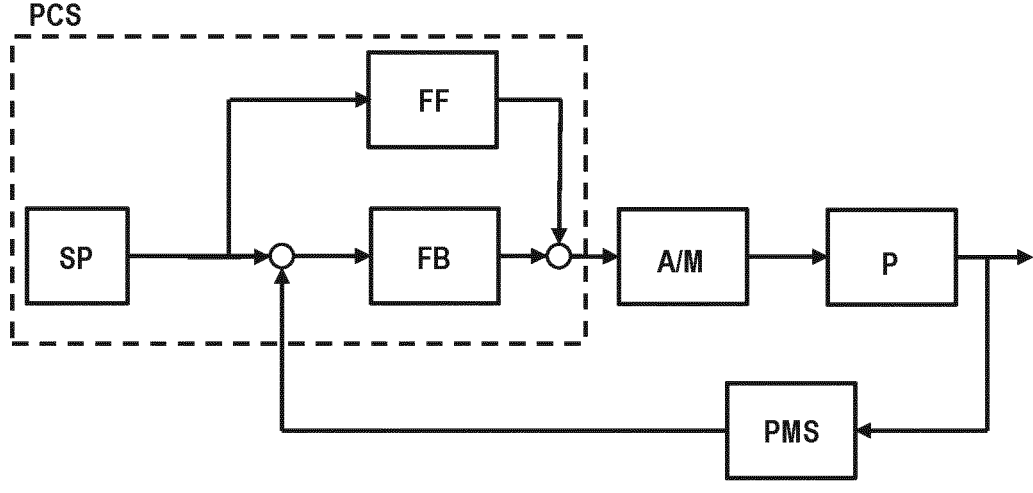
FIG. 3 schematically depicts a position control system.

The lithographic apparatus LA comprises a position control system PCS as schematically depicted in FIG. 3. Such a position control system can e.g. be used to control an actuator or motor as applied in the lithographic apparatus, e.g. an actuator or motor of the first positioner PM or the second positioner PW. The position control system PCS comprises a setpoint generator SP, a feedforward controller FF and a feedback controller FB. The position control system PCS provides a drive signal to the actuator or motor A/M. The actuator or motor A/M drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator or motor A/M. The reference signal may form an input for the feedforward controller FF. Based on the input, the feedforward controller FF provides at least part of the drive signal for the actuator or motor A/M. The feedforward FF may make use of information about dynamical characteristics of the plant P, such as mass, stiffness, resonance modes and eigenfrequencies.

Figure 4:
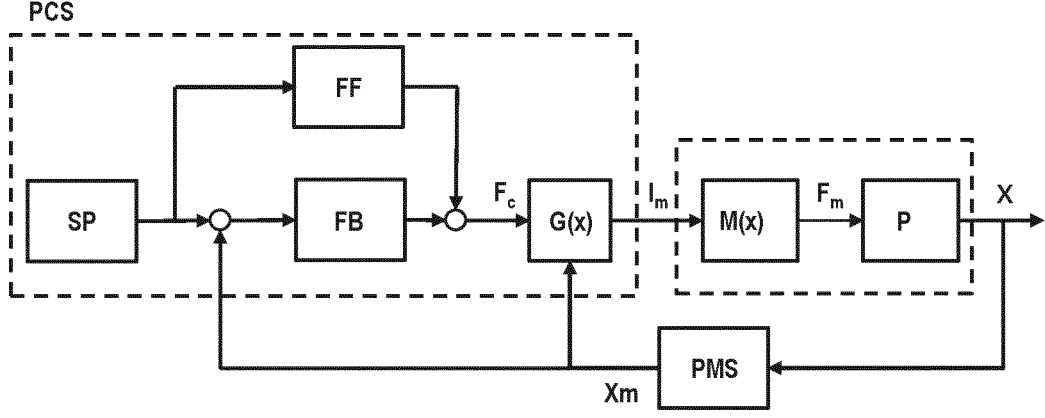
FIG. 4 schematically depicts a more detailed position control system.

FIG. 4 schematically shows a more detailed position control system for controlling a position of an electromagnetic motor. The position control system PCS as shown in FIG. 4 comprises a setpoint generator SP, a feedforward controller FF and a feedback controller FB. The combination of the outputs of feedback controller FB and the feedforward controller FF represents the required control forces Fc, i.e. the forces that are to be generated by the electromagnetic motor or motor system. The position control system PCS further comprises a position-dependent commutation model $G(x)$, which converts the required control forces Fc into motor currents Im that are to be supplied to the motor, e.g. by means of a power source.

Within the meaning of the present invention, a commutation model for an electromagnetic motor refers to a model which can determine a set of required motor currents Im, based on a set of desired forces Fc. As such, a commutation model can be considered to be the inverse of a motor model, i.e. a model which provides a set of forces as generated by the motor, based on a set of currents Im supplied to the motor. Using these definitions, a motor model can be considered to be the inverse of a commutation model. In the control scheme as shown, the motor currents $I_m$ as generated are used as input to a motor model $M(x)$ which provides a conversion to a set of generated motor forces Fm. Said motor forces Fm drive the plant P, which may comprise the substrate support WT or the mask support MT. An output of the plant P is a position quantity X, e.g. a position in one or more degrees of freedom. The position quantity X may e.g. be a (6×1) vector including 3 translational positions and 3 rotational positions. The position quantity X is measured with the position measurement system PMS. The position measurement system PMS generates a signal Xm, which is a position signal representative of the position quantity X of the plant P. Said position signal Xm is provided as input to the feedback controller FB and as input to the position dependent motor model $G(x)$. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB.

Ideally, the motor forces Fm as obtained by the application of the motor currents Im should correspond to the required or desired control forces Fc. Or, phrased differently, the commutation model $G(x)$ as applied in the position control scheme should ideally correspond to the inverse of the motor model $M(x)$. In practice, the commutation model $G(x)$ is found to be insufficiently accurate to determine the required motor currents Im, that are required to generate the desired control forces Fc. A reason for this inaccuracy can be found in the fact that such a commutation model $G(x)$ typically assumes certain geometric or physical properties of the motor, e.g. nominal geometric data and nominal physical characteristics, e.g. of magnets that are applied in the motor. So, typically, the commutation model $G(x)$ as applied can be considered a general commutation model for a certain type of motor. Such a model can e.g. be implemented as a lookup table, e.g. based on a physical model of the motor. The model is however not tailored to a specific example or specimen of the motor.

Due to mechanical and physical tolerances, individual motors will exhibit a different behaviour. As such, when using a general or generic commutation model to control a position of a particular motor, the actual motor forces as generated, Fm, will deviate from the desired control forces Fc, causing an inaccuracy in the positioning.

In order to mitigate or reduce such an error, attempts have been made to increase the accuracy of the commutation model G(x) as applied. In particular, one can in detail model each element of the commutation model G(x) as a function of the position X. Using empirical data, one can model the relationship between the required forces Fc and the motor currents Im, as a function of the position X of the motor.

Such an approach may be difficult to realise in practice, because of the large number of variables involved. In general, an electromagnetic motor can be considered to comprise a first member comprising a coil array and a second member comprising a magnet array, whereby the magnet array is configured to generate a spatially alternating magnetic field. The coil arrays and magnet arrays can be linear, i.e. one-dimensional arrays, or planar arrays, i.e. arrays of coils and magnets extending in two directions, e.g. two perpendicular directions. When the coil array of the motor is energized, i.e. supplied with currents, forces are generated due to the interaction between the current carrying coils and the magnetic field as generated by the magnet array. By applying appropriate currents, forces are generated causing a displacement between the first member and the second member. Typically the forces as generated cause a relative displacement between the first member and the second member in one or more degrees of freedom, up to 6 degrees of freedom, i.e. 3 translational degrees of freedom and 3 rotational degrees of freedom. As such, when a particular displacement is required or desired, in one or more degrees of freedom, one can determine, based on the mechanical characteristics of the motor, the required forces in the required one or more degrees of freedom. Referring to the position control scheme of FIG. 4, the position X may thus be an expression of the relative position of the first member and the second member, in the one or more degrees of freedom in which the motor is controlled. In case of a control in 6 degrees of freedom, i.e. 6 DOF, X as denoted in FIG. 4 may thus e.g. be a vector comprising an x-position, a y-position, a z-position, an Rx-position, an Ry-position and an Rz-position of the first member of the motor relative to the second member of the motor, whereby said motor is e.g. applied in a substrate support WT or a mask support MT. Based on said position, the controller, i.e. the feedback controller FB and the feedforward controller FF determine the required control forces Fc to reduce or eliminate any positional error. The control forces Fc will typically be a vector with the same dimensions as the position X, e.g. a vector comprising an x-force, a y-force, a z-force, an Rx-force or torque, an Ry-force or torque and an Rz-force or torque.

In general, the number of coils in the coil array of the electromagnetic motor that is involved in the generation of the desired forces can be much larger than the degrees of freedom that need to be controlled by the electromagnetic motor. This can e.g. be illustrated by the following FIGS. 5-6 which schematically illustrate electromagnetic motors which can be applied in an electromagnetic motor system according to the invention.

Figure 5:
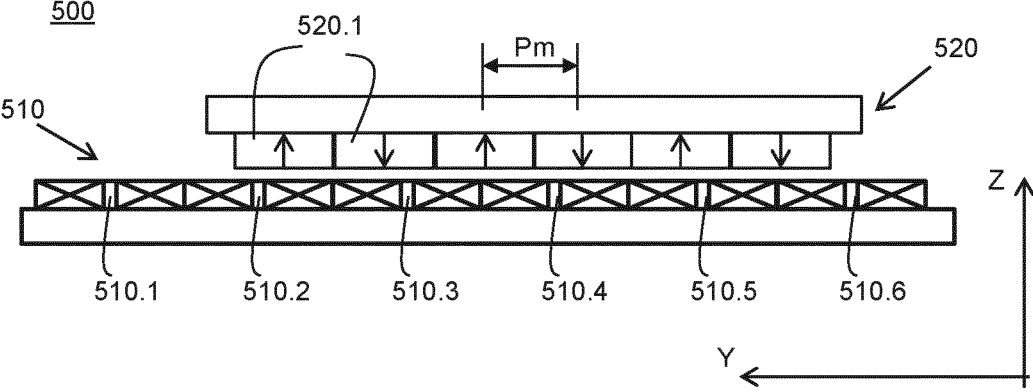
FIGS. 5, 6a and 6b schematically depict different electromagnetic motors as can be applied in an electromagnetic motor system according to the invention.

FIG. 5 schematically shows a cross-sectional view of a linear electromagnetic motor 500, the motor comprising a first member 510 and a second member 520. In the embodiment as shown, the first member 510 comprises a plurality of coils 510.1, 510.2, . . . , 510.6 arranged to form a coil array extending in the Y-direction. In the embodiment as shown, the second member 520 comprises a plurality of magnets 520.1, e.g. permanent magnets having a magnetisation direction as indicated by the arrows in the magnets 520.1. The magnets 520.1 are arranged to form a magnet array and are configured to generate a spatially alternating magnetic field. In the embodiment as shown, the magnet array is configured to generate a spatially alternating magnetic field in the Y-direction. In the arrangement as shown, the second member 520 is configured to displace, relative to the first member, at least in the Y-direction, when appropriate forces are generated due to the interaction of the coils of the coil array, when supplied with a current, and the magnetic field. It may occur, depending on the relative position of the first member 510 and the second member 520 in the Y-direction, that some of the coils of the coil array need not be energized, i.e. supplied with a current, because they do not interact with the magnetic field of the second member 520. However, in general, a plurality of coils will need to be energized and will interact with the magnetic field of the second member 520. For the relative position as shown in FIG. 5, at least coils 510.2-510.6 interact with the magnetic field of the magnet array and should therefore be supplied with currents.

The electromagnetic motor 500 as schematically shown in FIG. 5 can also be referred to as a moving-magnet motor because, in a typical application of said motor, the object to be moved or displaced would the connected or mounted to the second member 520, i.e. the motor member comprising the magnet array. In such arrangement, the second member 520 may e.g. be referred to as the mover, whereas the first member 510 may be referred to as the stator. In such an arrangement, the first member 510 or stator may be arranged as a stationary member. Alternatively, it may be movable as well, e.g. movable in the Y-direction by means of a bearing, thus resulting in the first member 510 or stator to act as a balance mass.

Figure 6A:
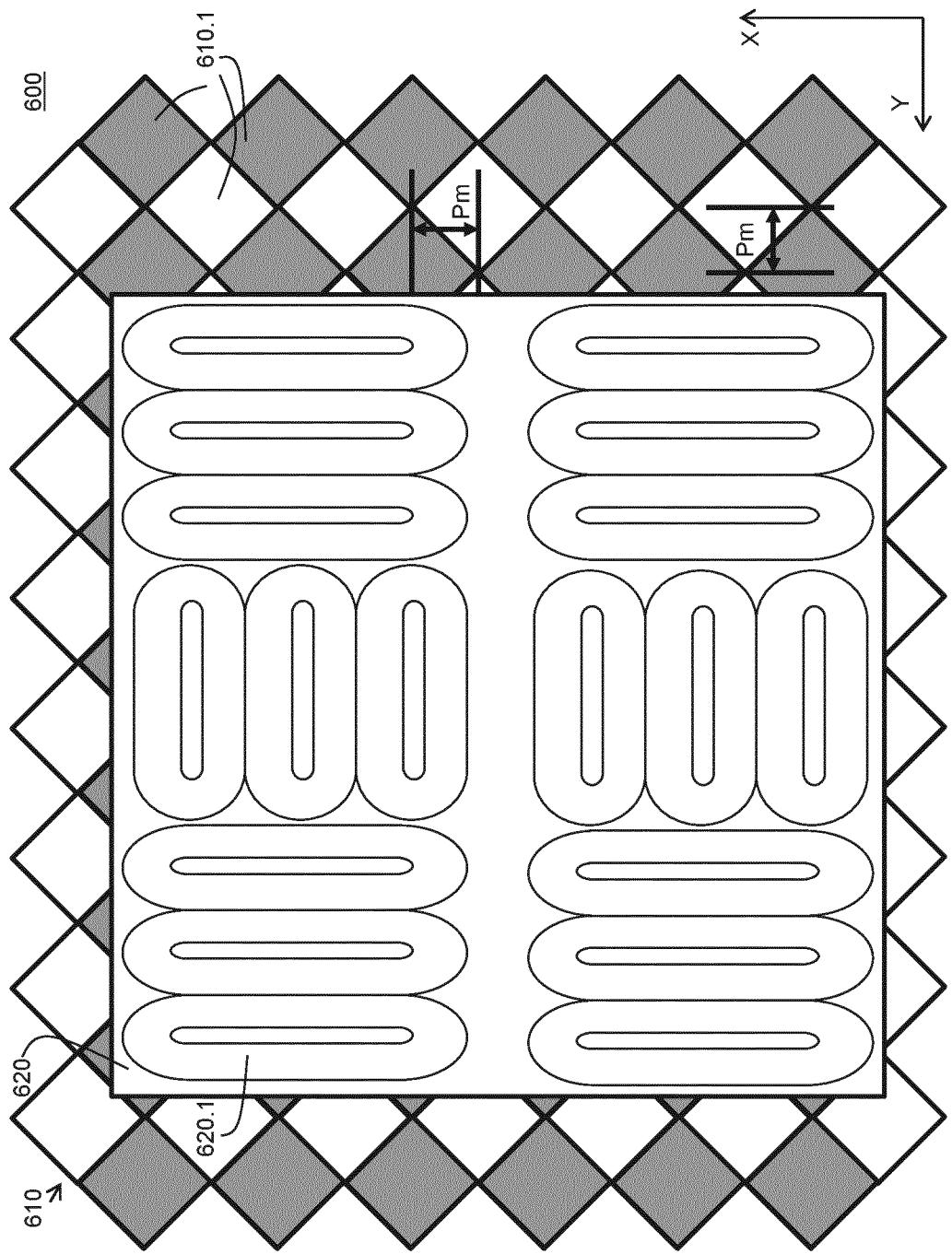

FIG. 6a schematically shows yet another example of an electromagnetic motor whereby a plurality of coils of a coil array interact with a spatially alternating magnetic field of a magnet array. FIG. 6a schematically shows a top view of an electromagnetic motor 600 having a first member 610 and a second member 620. The motor as shown can be referred to as a moving-coil planar motor. In the embodiment as shown, the first member 610 comprises a two-dimensional array of magnets 610.1, the array of magnets being configured to generate a spatially alternating magnetic field along two directions, i.e. the X-direction and the Y-direction. The second member 620 comprises a plurality of coils 620.1 arranged in a two-dimensional coil array and configured to interact with the spatially alternating magnetic field of the first member 610. By suitable control of the supplied currents to the coil array, the second member 620 can be displaced and positioned relative to the first member 610 in e.g. 6 degrees of freedom. For the example given, this however requires the control of 18 coil currents.

When the position control scheme of FIG. 4 would be used to control the motor 600 in 6 degrees of freedom, the following can be observed. In case the motor is controlled in 6 degrees of freedom, the position signal Xm can e.g. be a (6×1) vector. The same holds for the control forces Fc, said control forces being determined by the controller, i.e. the feedback controller FB and the feedforward controller FF, in order to reduce the difference between the actual position, as represented by the position signal Xm. For the motor as shown in FIG. 6, 18 coil currents Im need to be determined, implying that the commutation model G(x) is e.g. a (18×6) matrix, depending on the measured position Xm.

Figures 6B, 7:
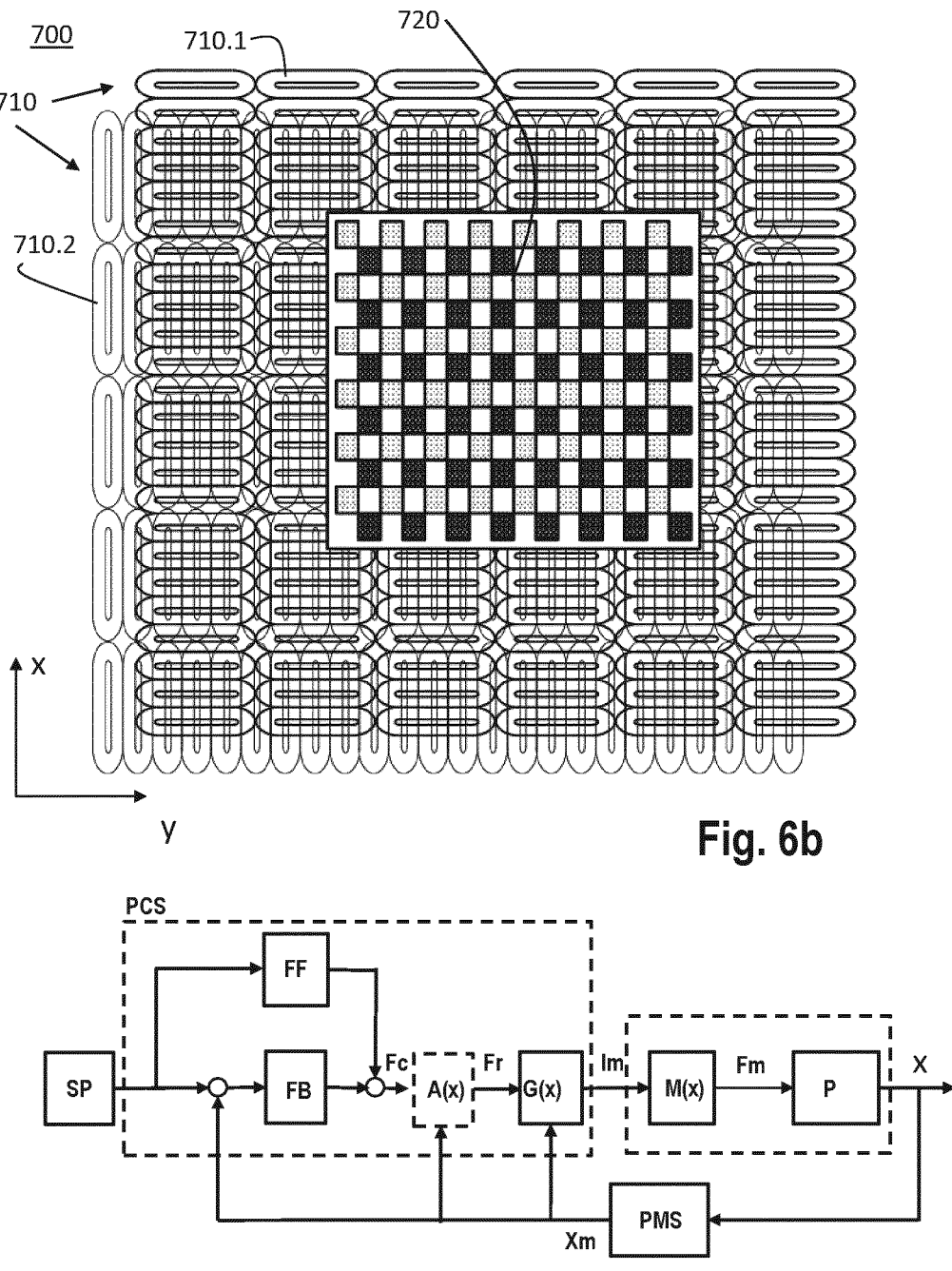
FIG. 7 schematically depicts a position control system according to an embodiment of the present invention.

FIG. 6b schematically shows yet another example of an electromagnetic motor whereby a plurality of coils of a coil array interact with a spatially alternating magnetic field of a magnet array. FIG. 6b schematically shows a top view of an electromagnetic motor 700 having a first member 710 and a second member 720. In the embodiment as shown, the second member 720 comprises a two-dimensional array of magnets 720.1, the array of magnets being configured to generate a spatially alternating magnetic field along two directions, i.e. the X-direction and the Y-direction. The motor as shown may e.g. be referred to as a moving-magnet planar motor. The first member 710 comprises a plurality of coils 710.1 and 710.2 arranged in a two-dimensional coil array and configured to interact with the spatially alternating magnetic field of the second member 720. In the embodiment as shown, the plurality of coils 710.1 comprises a two-dimensional array of coils that are elongated in the Y-direction, whereas the plurality of coils 710.2 comprises a two-dimensional array of coils that are elongated in the x-direction. For clarity purpose, the coil arrays 710.1 and 710.2 are shown somewhat shifted relative to each other in the XY-plane. In practice, they should substantially overlap each other in the XY-plane. By suitable control of the supplied currents to the coil arrays 710.1, 710.2, the second member 720 can be displaced and positioned relative to the first member 710 in e.g. 6 degrees of freedom. For the example given, this however requires the control of a large number of coil currents, e.g. 50 or more.

With respect to the motors as schematically shown in FIGS. 5, 6a and 6b, it can be pointed out that the magnet array of said motors, i.e. may also be realised using super-conductive coils or conductors. Such superconductive coils can thus be considered an alternative to the use of permanent magnets. They have the advantage of being capable of generating a higher magnetic field strength. As a result, the performance of the electromagnetic motor can be improved; the motor may be capable of generating larger forces, or generate forces with less dissipation in the coil array, compared to a motor having a magnet array with permanent magnets.

In order to improve the accuracy of the operation of the motor, detailing the commutation model G(x) has been found to be an inefficient manner to arrive at a desired outcome. Therefore, in accordance with the present invention, a different approach is proposed. In accordance with the present invention, a further modification to the known position control scheme is proposed.

FIG. 7 schematically shows a modified position control scheme, the modified position control scheme comprising a position control system PCS according to the present invention. Instead of trying to further detail or optimise the commutation model G(x), the position control system of the present invention applies a correction/modification to the determined control forces Fc. In particular, as can be seen in the position control scheme of FIG. 7, the determined control forces Fc are modified, using a newly introduced matrix A(x). The introduction of the new matrix A(x) enables to take account of any discrepancies that may occur between the desired control forces Fc and the actual motor forces Fm which are generated by the motor when a set of current Im is applied to the motor. Matrix A(x) can e.g. take account of variations in physical or mechanical properties of the components of a particular motor, e.g. variation of the spatially alternating magnetic field of the motor.

In particular, the matrix A(x) can take account of the actual position dependent magnetic field as generated by the magnet array of a particular electromagnetic motor. In order to do so, the elements of the matrix A(x) may be formulated as a summation of position dependent expressions, which can e.g. be a function of the magnetic pitch of the electromagnetic motor. In particular, elements of the matrix A(x) can e.g. be formulated as a summation of a base harmonic and one or more higher harmonics of the magnetic pitch of the electromagnetic motor. By doing so, any deviation between the actual spatially alternating magnetic field of a particular motor and the magnetic field as modelled in the general commutation model can be modelled using the matrix A(x). As an example, an element a(i, j) of matrix A(x) may e.g. be expressed as:

$$a(i, j) = a_0(i, j) + \sum_{k=1}^{m} \left( a_k(i, j)\sin\left(\frac{k\pi x}{\tau}\right) + b_k(i, j)\cos\left(\frac{k\pi x}{\tau}\right) \right) \quad (1)$$

Wherein $a_0(i,j)$, $a_k(i,j)$ and $b_k(i,j)$ are parameters that are to be determined as a function of the position X and wherein t represents the magnetic pitch of the spatially alternating magnetic field. For the given example, the number of parameters that needs to be determined for the element a(i,j) also depends on the order m, i.e. the order of the higher harmonics of the magnetic field that needs to be taken into account. In FIGS. 5 and 6a, the magnetic pitch of the applied magnet arrays is denoted by Pm.

It can be pointed out that other parameterized expressions, i.e. alternatives for equation (1), may be considered as well to describe the matrix elements a(i,j). other periodic functions or polynomial functions, or exponential functions can be considered as well. By doing so, effects such as end-effects of the magnet arrays or force dependencies as a function of the relative position of the motor members in the Z-direction can be modelled as well. Depending on the type of motor, and the desired accuracy, the parameter of the matrix A(x) can be determined as a function of one or more degrees of freedom in which the motor operates. In case of a linear motor such as the motor shown in FIG. 5, the parameters may e.g. be determined or expressed as a function of the Y-position of the mover 520 relative to the stator 510. In case the linear motor 500 of FIG. 5 is operated in such manner that the Z-position of the mover 520 relative to the stator 510 may vary as well, the parameters of the matrix A(x) can be expressed as a function of the Z-position as well.

As will be explained in more detail below, the matrix A(x) can e.g. be determined based on empirical data, e.g. obtained by subjecting the electromagnetic motor to a predetermined motion profile.

Compared to the method whereby an optimisation of the commutation matrix G(x) is attempted, it can be pointed out that the approach as provided by the present invention, i.e. the introduction of the matrix A(x), provides a more efficient approach. In general, the new matrix A(x) will be of a lower dimension than the commutation matrix or commutation model G(x). In case the subject electromagnetic motor is controlled in N degrees of freedom, A(x) can e.g. be an N×N matrix, e.g. a (6×6) matrix for the example given above. In case the electromagnetic motor would have M coils in the coil array, whereby M typically would be larger or much larger than N, the commutation matrix G(x) would be an M×N matrix, e.g. an (18×6) matrix for the example given above in FIG. 6a or an (50×6) matrix for the example given in FIG. 6b. Once the matrix A(x) has been determined, the combination of the matrix A(x) and the initial, general commutation model G(x) can thus be considered a motor-dependent commutation model G(x)*A(x).

Referring to the position control scheme of FIG. 7, the objective of the motor-dependent motor model G(x)*A(x) is such that, when the control forces Fc, as determined by the controller, are applied to said model, a set of required currents Im is determined, which, when supplied to the motor (represented by the motor model M(x)), result in actual forces Fm that would correspond to Fc. Phrased different, the use of the motor-dependent motor model G(x)*A(x) results in a set of currents Im, which will be slightly different from the set of currents Im obtained when only the commutation model G(x) is used, said set of currents Im causing the motor to generate actual forces Fm which are more in line with the control forces Fc. The position control system PCS as schematically shown in FIG. 7 can e.g. be embodied in a control system or control unit or controller, as will be explained in more detail below. In the scheme as shown in FIG. 7, the position control system PCS is configured to receive a setpoint from a setpoint generator SP and use this setpoint, together with the position signal Xm to determine the required currents Im to be supplied to the coils of the electromagnetic motor. It can be pointed out that the position control system may also comprise the setpoint generator SP, similar to the arrangements shown in FIGS. 3 and 4.

The present invention thus provides, in a first aspect, a method of determining a motor-dependent commutation model for an electromagnetic motor. This method is illustrated in FIG. 8. The method according to the invention can in general be applied for an electromagnetic motor that comprises a first member comprising a coil array with at least M coils, and a second member comprising a magnet array configured to generate a spatially alternating magnetic field. It is further assumed that the first member and the second member are configured to displace relative to each other in N degrees of freedom, whereby N<M, by supplying the at least M coils with respective at least M currents Im, thereby generating forces in the N degrees of freedom. The motors as schematically shown in FIGS. 5 and 6 meet these requirements. Such motors may thus be advantageously be equipped with a position control system according to the present invention, said position control system using the motor-dependent commutation model as obtained from the method according to the invention.

In order to arrive at the motor-dependent motor model, the method according to the invention comprises a first step 810 of obtaining a commutation model G for the electromagnetic motor, the commutation model G providing a relationship between desired forces Fc in the N degrees of freedom and the at least M currents Im applied to the coil array by Im=G*Fc. The commutation model G may e.g. obtained based on physical parameters of the motor and/or based on simulations.

The method further comprises a second step 820 of defining an N×N motor-dependent compensation matrix A.

The method further comprises a third step 830 of operating the electromagnetic motor by performing a predetermined displacement by:

determining the desired forces Fc to realize the predetermined displacement determining the at least M currents Im for the coil array by Im=G*Fc;

applying the at least M currents Im to perform the predetermined displacement.

In the third step 830 of the method according to the first aspect of the invention, a predetermined displacement is performed with the particular motor for which the motor-dependent compensation matrix A is to be determined. In an embodiment, the predetermined displacement comprises performing a displacement along a predetermined trajectory, e.g. at a substantially constant velocity, whereby a small sinusoidal force variation is superimposed during the displacement. This can e.g. be done by adding a sinusoidal position setpoint to a linear position setpoint. Such a linear position setpoint can e.g. be expressed as:

$$x(t) = A_0 * t \qquad (2)$$

using such linear varying position setpoint, the motor will displace in the x-direction at a substantially constant speed.

Similarly, a sinusoidal position setpoint or sinusoidally varying position setpoint can be expressed as:

$$X(t) = A_1 * \sin(2\pi f * t) \qquad (3)$$

The sinusoidally varying position setpoint will cause the motor to following a sinusoidally varying trajectory with a amplitude $A_1$ at a frequency f.

The frequency f corresponding to the sinusoidal position setpoint preferably is selected such that the controller is capable of accurately tracking this reference. The amplitude A1 is chosen such that a certain defined amount of force is needed by the motor. Phrased differently, the amplitude A1 can be selected such that a sufficiently large force, e.g. a force about a certain threshold, is needed to realise the displacement. The linear position setpoint, corresponding to travelling at a constant velocity ensures that the motor travels over a number of motor or magnetic pitches, thus enabling the determination of the position dependent parameters. In an embodiment, the displacement substantially covers the entire operating range of the electromagnetic motor. In case of a planar motor, the displacement may thus cover a two-dimensional area. Referring to the position control scheme of FIG. 7, the third step 830 is thus performed with matrix A set equal to the unity matrix. Alternatively, one could consider that in the third step 830, the standard control scheme as shown in FIG. 4 is applied, i.e. using the regular commutation model G(x) to determine the coil currents Im.

The method further comprises a fourth step 840 of determining actual forces Fm in the N degrees of freedom occurring during the predetermined displacement. In this respect, it can be pointed out that the actual forces Fm as generated by the motor can, in an embodiment, be derived from the occurring acceleration of the motor, using Fm=mass*acceleration, whereby the acceleration can be derived from the measured position, i.e. position signal Xm in FIGS. 4 and 7, by taking the time-derivative twice. In case the frequency is low enough and an accurate tracking can be realized, the acceleration corresponding to the applied setpoint can be used, instead of the actual acceleration.

The method according to the invention further comprises a fifth step 850 of determining the compensation matrix A based on Fc=A*Fm. During the third step 830 of performing the predetermined displacement, the control forces Fc as determined by the controller, in the examples given the feedforward controller FF and the feedback controller FB, can be traced or recorded and they can thus be compared to the actual forces Fm generated by the motor, i.e. the actual forces Fm as determined in the fourth step 840 of the method according to the invention. Based on the determined actual forces Fm and the traced control forces Fc, the elements of the matrix A can be determined, e.g. using a least-squares or other fitting method. Referring to FIG. 4, one can derive that the relationship between the control forces Fc and the actual forces Fm can be expressed as:

$$Fm = M(x) * G(x) * Fc \text{ or } Fc = G^{-1}(x) * M^{-1}(x) * Fm \qquad (4)$$

In accordance with the fifth step 850 of the method according to the present invention, said relationship between the control forces Fc and the actual forces Fm is thus determined as the matrix A(x).

In an embodiment of the present invention, A(x) can be a full matrix, i.e. each element a(i,j) of the matrix A(x) being a non-zero element and comprising at least one parameter or variable that needs to be determined during step 850 of the method according to the invention.

Alternatively, the matrix A(x) can contain one or more elements that are set equal to zero. Based on physical considerations or empirical data about the motor that is being analysed or calibrated, one can decide, e.g. in step 820 of the method according to the invention, to set certain elements, e.g. certain non-diagonal elements, to zero, thus reducing the number of parameters that needs to be determined.

In a sixth step 860 of the method according to the invention, the motor-dependent commutation model is obtained as G*A.

The method of determining a motor-dependent motor model according an embodiment of the invention thus results in a modified commutation model G*A which can replace the commutation model G(x), as e.g. applied in the position control scheme of FIG. 4. When considering that A(x) in fact corresponds to $G^{-1}(x)*M^{-1}(x)$, see equation (4), one can derive that the modified commutation model G*A or G(x)*A(x) in fact corresponds to $M^{-1}(x)$, or the inverse of the motor model M(x).

Figure 9:
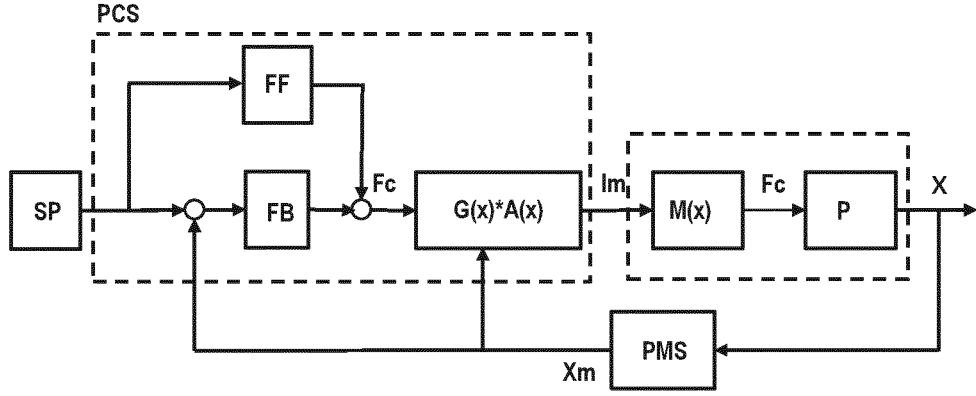
FIG. 9 schematically depicts a position control system according to another embodiment of the present invention.

The present invention may thus provide in a position control scheme for an electromagnetic motor as schematically shown in FIG. 9.

In the position control scheme according to an embodiment of the present invention shown in FIG. 9, the motor-dependent motor model G(x)*A(x) as determined by the method according to the invention is applied to determine, based on the required control forces Fc, the required coil currents Im that need to be supplied to the electromagnetic motor, such that the motor indeed, or more accurately, generates the required control forces Fc. When more accurate coil currents Im, i.e. currents that are tailored to the specific applied motor, are applied to the motor, the position X of the plant P, which may e.g. comprise a substrate support or a mask support MT when applied in a lithographic apparatus, will more accurately correspond to the desired position as dictated by the set point SP. As such, as a result of the application of the motor-dependent motor model G(x)*A(x) as derived in accordance with the present invention, the positioning accuracy of an electromagnetic motor can be significantly improved. The present invention can thus advantageously be applied in applications where a high positioning accuracy is required. In particular, the invention may advantageously be applied to control electromagnetic motors as applied in stages or positioning devices in a lithographic apparatus, e.g. for the positioning of patterning devices or substrates. In such applications, a positioning accuracy in the order of a few nm or less is often desirable. In order to achieve this, a cascaded arrangement of a coarse positioning device, e.g. comprising one or more electromagnetic motors, and a fine positioning device, e.g. comprising one or more short stroke actuators, is often required. Using the present invention, it may however be possible to achieve the desired positioning accuracy without the application of the fine positioning device. Alternatively, the improved accuracy of the coarse positioning device, obtained due to the application of the present invention, may enable a more relaxed design of the fine positioning device or may enable the application of a different type of fine positioning device.

The position control system PCS according to the present invention can e.g. be embodied as a control unit controller, or as a software implementation. In an embodiment, the position control system can thus comprise a control unit that is configured to receive input signals, process said signals and generate output signals. In an embodiment of the present invention, such a control unit may e.g. comprise an input terminal for receiving signals such as a set point signal SP and a position signal Xm, as e.g. shown in FIG. 9. Such a control unit may further comprise a processing unit or processor for processing the signals as received. The processing unit or processor may e.g. be configured to determine, based on the set point SP and the position signal Xm, the required control forces Fc and required currents for the coils of the electromagnetic motor that is controlled. In order to arrive at said desired or required currents for the coils, the control unit as applied can comprise the motor-dependent commutation model G(x)*A(x) as obtained by the method according to the invention. Said motor-dependent commutation model may e.g. be stored in the control unit, e.g. in a memory unit of the control unit, or may be accessible to the control unit via a communication terminal, e.g. a communication terminal connected or connectable to a network, e.g. a wired or wireless network. The control unit as applied in the electromagnetic motor according to the invention may further be configured to output, e.g. via an output terminal of the control unit, the required control signals for the electromagnetic motor, the control signals e.g. representing the required currents for the coils.

Figure 10:
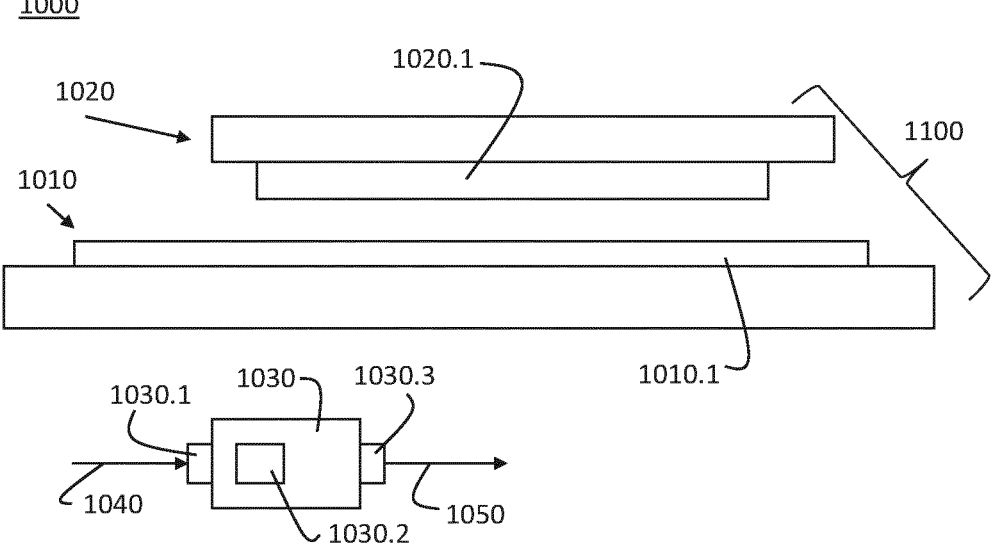
FIG. 10 schematically depicts an electromagnetic motor system according to the present invention.

According to an aspect of the present invention, there is further provided an electromagnetic motor system which comprises an electromagnetic motor and a control unit that uses the motor-dependent motor model as determined by the method according to the invention. Such a motor system is schematically shown in FIG. 10. In particular, the present invention provides an electromagnetic motor system 1000 that comprises an electromagnetic motor 1100 and a control unit 1030. In accordance with the invention, the electromagnetic motor 1100 comprises a first member 1010 comprising a coil array 1010.1 with at least M coils, and a second member 1020 comprising a magnet array 1020.1 configured to generate a spatially alternating magnetic field. The first member 1010 and the second member 1020 are further configured to displace relative to each other in N degrees of freedom, whereby N<M, by supplying the at least M coils with respective at least M currents Im, thereby generating forces in the N degrees of freedom. In accordance with the invention, the electromagnetic motor system 1000 according to the invention further comprises a control unit 1030 configured to generate control signals 1050 for controlling the electromagnetic motor, whereby the control unit comprises a motor-dependent commutation model obtained using the method according to the invention.

In accordance with the present invention, a control unit 1030 of an electromagnetic motor system 1000 is a device or a software implementation that is configured to receive input signals, process said signals and generates output signals. In an embodiment of the present invention, the control unit of the electromagnetic motor system may e.g. comprise an input terminal 1030.1 for receiving signals 1040 such as a set point signal SP and a position signal Xm, as e.g. shown in FIG. 7 or 9. The control unit 1030 may comprise a processing unit or processor 1030.2 for processing the signals as received. The processing unit or processor may e.g. be configured to determine, based on the set point SP and the position signal Xm, the required control forces Fc and required currents for the M coils of the electromagnetic motor. In order to arrive at said desired or required currents for the M coils, the control unit as applied can comprise the motor-dependent commutation model G(x)*A(x) as obtained by the method according to the invention. Said motor-dependent commutation model may e.g. be stored in the control unit 1030, e.g. in a memory unit of the control unit, or may be accessible to the control unit via a communication terminal, e.g. a communication terminal connected or connectable to a network, e.g. a wired or wireless network. The control unit 1030 as applied in the electromagnetic motor system according to the invention may further be configured to output, e.g. via an output terminal 1030.3 of the control unit 1030, the required control signals 1050 for the electromagnetic motor, the control signals e.g. representing the required currents for the M coils.

In an embodiment of the present invention, the electromagnetic motor system further comprises a power converter for powering the coil array 1010.1 of the first member 1010 of the electromagnetic motor. Such a power converter may e.g. comprise a plurality of current sources for powering the different coils of the coil array 1010.1. In such embodiment, the power converter may e.g. be configured to receive the control signals 1050 as generated by the control unit 1030 of the electromagnetic motor system 1000.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and In doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

CLAUSES

1. Method of determining a motor-dependent commutation model for an electromagnetic motor, whereby the electromagnetic motor comprises a first member comprising a coil array comprising at least M coils, and a second member comprising a magnet array configured to generate a spatially alternating magnetic field, whereby the first member and the second member are configured to displace relative to each other in N degrees of freedom, N<M, by supplying the at least M coils with respective at least M currents Im, thereby generating forces in the N degrees of freedom, the method comprising the steps of: obtaining a commutation model G for the electromagnetic motor, the general commutation model G providing a relationship between desired forces Fc in the N degrees of freedom and the at least M currents Im applied to the coil array by Im=G*Fc; defining an N×N motor-dependent compensation matrix A; operating the electromagnetic motor by performing a predetermined displacement by: determining the desired forces Fc to realise the predetermined displacement; determining the at least M currents Im for the coil array by Im=G*Fc; applying the at least M currents Im to perform the predetermined displacement; determining actual forces Fm in the N degrees of freedom occurring during the predetermined displacement; determining the compensation matrix A based on Fc=A*Fm. obtaining the motor-dependent commutation model as G*A.

2. The method according to clause 1, wherein the compensation matrix A comprises N×N parameters.

3. The method according to clause 2, wherein the N×N parameters are dependent on a relative position between the first member and the second member.

4. The method according to clause 3, wherein the first member and the second member are configured to displace relative to each other in an X-direction, and wherein at least some of the parameters comprise a periodic function in the X-direction.

5. The method according to clause 4, wherein the period function in the X-direction comprises a base harmonic associated with a magnetic pitch of the array of magnets.

6. The method according to clause 5, wherein the periodic function in the X-direction further comprises one or more higher harmonics associated with the magnetic pitch of the array of magnets.

7. The method according to any of the preceding clauses, wherein the predetermined displacement comprises a displacement at a constant velocity.

8. The method according to clause 7, wherein the predetermined displacement further comprises a sinusoidal profile superimposed on the constant velocity displacement.

9. The method according to any of the preceding clauses, wherein at least one non-diagonal element of the motor-dependent compensation matrix is set equal to zero.

10. An electromagnetic motor system, comprising:

an electromagnetic motor comprising a first member and a second member, the first member comprising a coil array comprising at least M coils;

the second member comprising an array of magnets configured to generate a spatially alternating magnetic field, whereby the first member and the second member are configured to displace relative to each other in N degrees of freedom, N<M, by supplying the at least M coils with respective at least M currents Im, thereby generating forces in the N degrees of freedom, wherein the electromagnetic motor system further comprises a control unit configured to generate control signals for controlling the electromagnetic motor, whereby the control unit comprises a motor-dependent commutation model obtained using the method according to any of the clauses 1-9.

11. The electromagnetic motor system according to clause 10, wherein the coil array comprises a first set of coils arranged along a first direction and a second set of coils arranged along a second direction, substantially perpendicular to the first direction, and wherein the array of magnets is configured to generate the spatially alternating magnetic field along the first direction and the second direction.

12. The electromagnetic motor system according to clause 11, wherein the control unit is configured to control a displacement of the first member relative to the second member in N=6 degrees of freedom.

13. The electromagnetic motor system according to clause 12, wherein the magnets comprise permanent magnets.

14. The electromagnetic motor system according to any of the clauses 10-13, wherein the coil array is arranged in a base member, and the array of magnets is arranged on a stage member, configured to displace relative to the base member.

15. The electromagnetic motor system according to any of the clauses 10-14, further comprising a power converter for powering the coil array of the first member of the electromagnetic motor.

16. Position control system for an electromagnetic motor, the electromagnetic motor comprising a first member and a second member, the first member comprising a coil array comprising at least M coils;

the second member comprising an array of magnets configured to generate a spatially alternating magnetic field, whereby the first member and the second member are configured to displace relative to each other in N degrees of freedom, N<M, by supplying the at least M coils with respective at least M currents Im, thereby generating forces in the N degrees of freedom, the position control system comprising a control unit configured to generate control signals for controlling the electromagnetic motor, whereby the control unit comprises a motor-dependent commutation model obtained using the method according to any of the clauses 1-9.

17. Stage apparatus for use in a lithographic apparatus, the stage apparatus comprising an electromagnetic motor system according to any of the clauses 10-15.

18. The stage apparatus according to clause 17, wherein the stage apparatus comprises an object holder that is mounted to the first member or the second member.

19. The stage apparatus according to clause 18, wherein the object holder is configured to hold a patterning device or a substrate.

20. Lithographic apparatus comprising a stage apparatus according to any of the clauses 17-19.

The invention claimed is:

1. A method of determining a motor-dependent commutation model for an electromagnetic motor, whereby the electromagnetic motor comprises a first member comprising a coil array comprising at least M coils, and a second member comprising an array of magnets configured to generate a spatially alternating magnetic field, whereby the first member and the second member are configured to displace relative to each other in N degrees of freedom, N<M, by supplying the at least M coils with respective at least M currents Im, thereby generating forces in the N degrees of freedom, the method comprising:

obtaining a commutation model G for the electromagnetic motor, the commutation model G providing a relationship between desired forces Fc in the N degrees of freedom and the at least M currents Im applied to the coil array by Im=G*Fc;

defining an N×N motor-dependent compensation matrix A;

operating the electromagnetic motor by performing a predetermined displacement by:

determining the desired forces Fe to realise the predetermined displacement;

determining the at least M currents Im for the coil array by Im=G*Fc; and applying the at least M currents Im to perform the predetermined displacement;

determining actual forces Fm in the N degrees of freedom occurring during the predetermined displacement;

determining the compensation matrix A based on Fc=A*Fm; and obtaining the motor-dependent commutation model as G*A, wherein performing the predetermined displacement comprises performing a displacement at a substantially constant speed along a predetermined trajectory and superimposing a substantially sinusoidal force variation during the displacement.

2. The method of claim 1, wherein performing the predetermined displacement comprises applying a linear position setpoint, corresponding to a displacement at a substantially constant speed, combined with a sinusoidal position setpoint causing the sinusoidal force variation at a predefined frequency.

3. The method of claim 2, wherein an amplitude of the sinusoidal position setpoint causes a force of the electromagnetic motor to be above a predefined threshold.

4. The method of claim 1, wherein the linear position setpoint at least spans multiple magnetic pitches of the electromagnetic motor.

5. The method of claim 1, wherein the predetermined displacement covers a two-dimensional area.

6. The method of claim 5, wherein the two-dimensional area covers an operating range of the electromagnetic motor.

7. The method of claim 1, wherein the compensation matrix A comprises N×N parameters.

8. The method of claim 7, wherein the N×N parameters are dependent on a relative position between the first member and the second member.

9. The method of claim 8, wherein the first member and the second member are configured to displace relative to each other in an X-direction, and wherein at least some of the parameters comprise a periodic function in the X-direction.

10. The method of claim 9, wherein the period function in the X-direction comprises a base harmonic associated with a magnetic pitch of the array of magnets, wherein the periodic function in the X-direction further comprises one or more higher harmonics associated with the magnetic pitch of the array of magnets.

11. The method of claim 1, wherein the predetermined displacement comprises a displacement at a constant velocity.

12. The method of claim 11, wherein the predetermined displacement further comprises a sinusoidal profile superimposed on the constant velocity displacement, wherein at least one non-diagonal element of the motor-dependent compensation matrix is set equal to zero.

13. An electromagnetic motor system, comprising:

an electromagnetic motor comprising a first member and a second member, the first member comprising a coil array comprising at least M coils and the second member comprising an array of magnets configured to generate a spatially alternating magnetic field, wherein the first member and the second member are configured to displace relative to each other in N degrees of freedom, N<M, by supplying the at least M coils with respective at least M currents Im, thereby generating forces in the N degrees of freedom, wherein the electromagnetic motor system further comprises a control unit configured to generate control signals for controlling the electromagnetic motor, and wherein the control unit comprises a motor-dependent commutation model obtained using the method of claim 1.

14. The electromagnetic motor system of claim 13, wherein the coil array comprises a first set of coils arranged along a first direction and a second set of coils arranged along a second direction, substantially perpendicular to the first direction, and wherein the array of magnets is configured to generate the spatially alternating magnetic field along the first direction and the second direction.

15. The electromagnetic motor system of claim 14, wherein the control unit is configured to control a displacement of the first member relative to the second member in N=6 degrees of freedom, wherein the array of magnets comprises permanent magnets.

16. The electromagnetic motor system of claim 13, wherein the coil array is arranged in a base member, and the array of magnets is arranged on a stage member, configured to displace relative to the base member.

17. The electromagnetic motor system of claim 13, further comprising a power converter for powering the coil array of the first member of the electromagnetic motor.

18. A position control system for an electromagnetic motor, the electromagnetic motor comprising a first member and a second member, the first member comprising a coil array comprising at least M coils and the second member comprising an array of magnets configured to generate a spatially alternating magnetic field, wherein the first member and the second member are configured to displace relative to each other in N degrees of freedom, N<M, by supplying the at least M coils with respective at least M currents Im, thereby generating forces in the N degrees of freedom, wherein the position control system comprising a control unit configured to generate control signals for controlling the electromagnetic motor, and wherein the control unit comprises a motor-dependent commutation model obtained using the method of claim 1.

19. A stage apparatus for use in a lithographic apparatus, the stage apparatus comprising the electromagnetic motor system of claim 13, wherein the stage apparatus comprises an object holder that is mounted to the first member or the second member, wherein the object holder is configured to hold a patterning device or a substrate.

20. A lithographic apparatus, comprising the stage apparatus of claim 19.

*    *    *    *    *